United States Patent [19]

Vetanen et al.

[11] Patent Number: 4,642,259
[45] Date of Patent: Feb. 10, 1987

[54] SOURCE-SIDE SELF-ALIGNED GATE PROCESS

[75] Inventors: William A. Vetanen, Hillsboro; Kimberly R. Gleason, Portland; Irene G. Beers, Tigard, all of Oreg.

[73] Assignee: Triquint Semiconductors, Inc., Beaverton, Oreg.

[21] Appl. No.: 727,485

[22] Filed: Apr. 26, 1985

[51] Int. Cl.$^4$ .......................... B32B 3/10; G03C 5/00; H01L 21/00
[52] U.S. Cl. ..................... 428/137; 428/901; 148/1.5; 29/576 B; 29/576 C; 29/578; 430/312; 430/313; 430/314; 430/319; 430/323; 430/324; 430/329
[58] Field of Search ............... 430/312, 313, 314, 316, 430/317, 319, 323, 324, 329; 29/576 B, 576 C, 578; 148/1.5, 187; 428/137, 901

[56] References Cited

U.S. PATENT DOCUMENTS 4,381,956  5/1983  Lane .................................... 148/187
4,540,446  9/1985  Nonaka et al. ...................... 148/1.5

*Primary Examiner*—John E. Kittle
*Assistant Examiner*—Patrick Ryan
*Attorney, Agent, or Firm*—William S. Lovell; Alexander C. Johnson, Jr.; John D. Winkelman

[57] ABSTRACT

A self-aligned gate GaAsFET fabrication process and structure are disclosed in which the gate metallization is offset to one side of the channel aligned with the source-side implant. The arrangement is advantageously provided by a photolithographic fabrication process in which a pair of self-aligned implants are made, before gate metallization. As an intermediate step, a first etch-resistant ZrO patch is deposited over at least one of the self-aligned implants aligned therewith. Then, a second such patch is deposited which overlaps the other self-aligned implant and extend a distance over the channel between the two implants. The first and second patches are thereby spaced closer together (e.g., 0.5 μm) than the implants (e.g., 1.0 μm). The patches fix the gate length at less than implant spacing and offset the gate metallization along the source-side self-aligned implant, away from the drain implant. The gate is preferably recessed. This arrangement effectively provides asymmetrical doping concentrations on opposite sides of the gate conductor, which enables improvement in both gate-drain capacitance $C_{gd}$ and source-gate resistance $R_s$.

20 Claims, 7 Drawing Figures

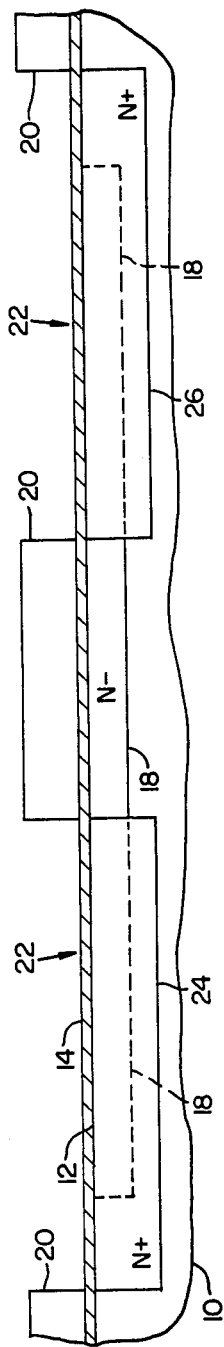
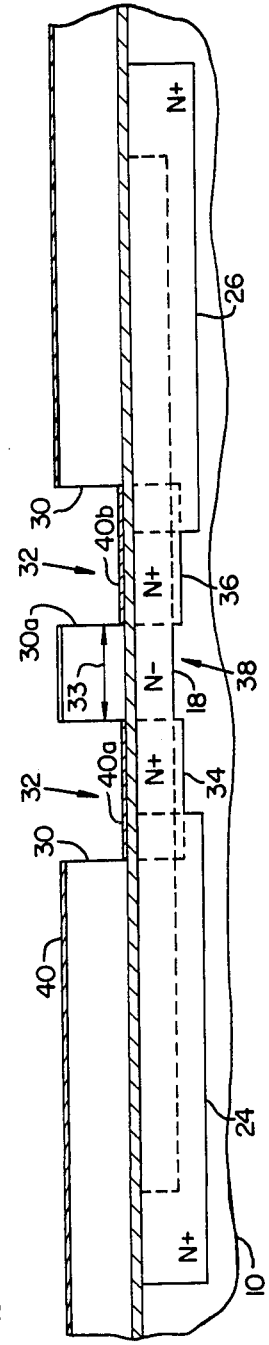
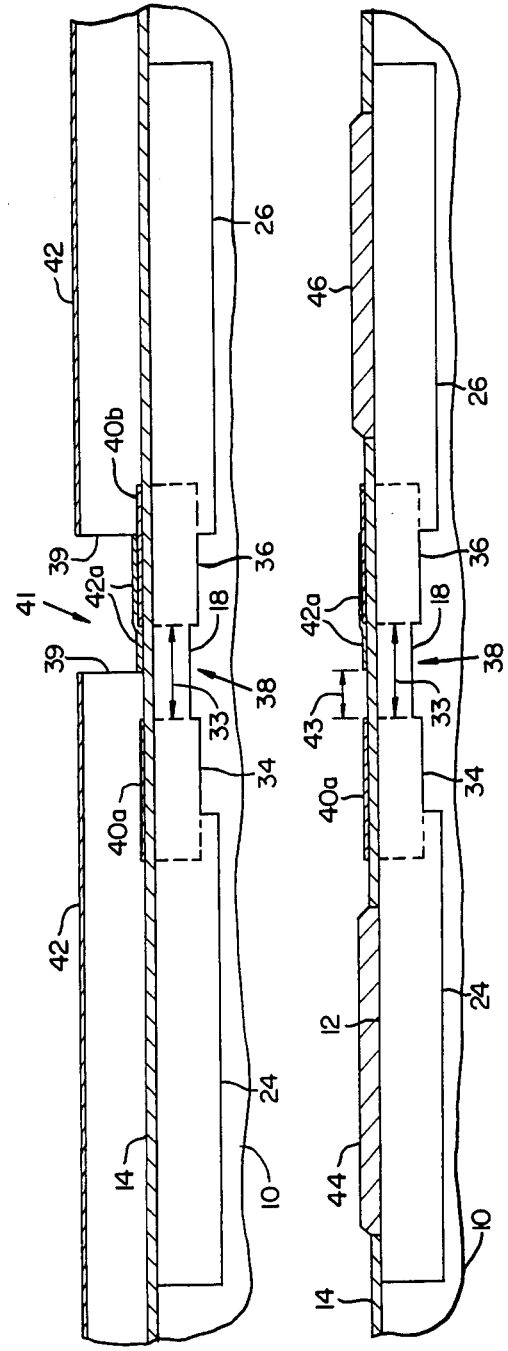
FIG.1 FIG.2 FIG.3 FIG.4

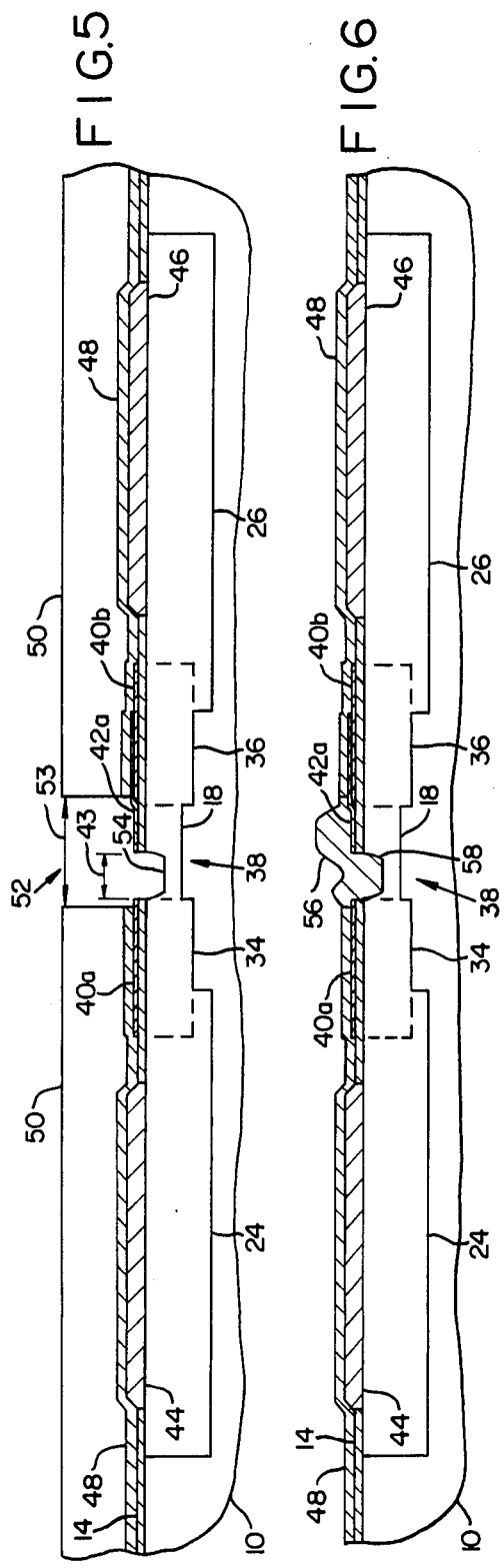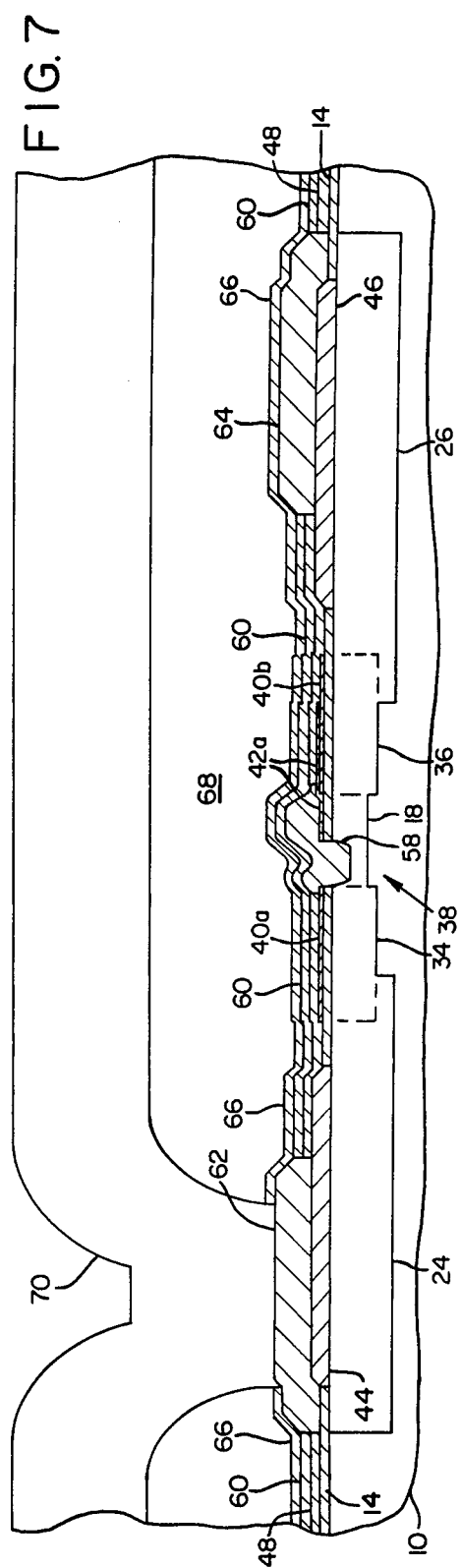

SOURCE-SIDE SELF-ALIGNED GATE PROCESS

TECHNICAL FIELD

The present invention relates to a process for making self-aligned gates in integrated circuits, and more particularly to a process for producing self-aligned N+ implanted regions in a Schottky barrier gate in a gallium arsenide (GaAs) enhancement-mode MESFET.

BACKGROUND OF THE INVENTION

In the manufacture of integrated circuits on silicon, self-alignment between the gate and the source and drain regions has previously been used to improve FET device performance over prior structures in which the gate overlapped the source and drain regions. Conventionally, as shown in Millman, *Microelectronics*, pp. 250-252 (1979), self-alignment is obtained in MOSFET fabrication by first applying the gate metallization, masking to define implant regions on each side of the gate, and then ion implanting into silicon through openings in the mask on each side of the gate. The implanted ions cannot penetrate the gate metal and therefore the ions enter the substrate only through the mask openings on either side of the gate. Ion implantation is essentially a line-of-sight process and so the edges of the implant regions are closely aligned with the edges of the gate metallization.

Recently, substantial attention has been devoted to the fabricationn of FET circuits in gallium arsenide. In constructing a field effect device in a semiconductor material such as silicon, i.e., to make a MOSFET, the metal gate electrode is separated by an oxide layer from the semiconductor channel. In making field effect devices in a semi-insulating material, such as GaAs, the gate metal is placed in direct contact with the semiconductor. An example of one process for making GaAsFET digital integrated circuits is described in "A High-Yield GaAs MSI Digital IC Process" by A. Rode, A. McCamant, G. McCormack and B. Vetanen, published in the minutes of the International Electron Devices Meeting, December 1982. This article describes a depletion-mode non-self-aligned gate GaAsFET process.

In the case of a depletion-mode device, with the gate unbiased, the active region below the gate is conductive. However, for many applications, it is preferable for such region to be nonconductive when the gate is unbiased, which requires an enhancement-mode (E-mode) structure. In GaAsFET devices, enhancement-mode requires that the channel be lightly doped or thin enough that the inherent gate depletion layer pinches off the channel at zero gate bias.

It is also necessary, however, to maintain conductivity on either side of the channel, between the source and gate and between the gate and drain. In a device shown in FIG. 1 of the Rode, et al. article, the gate is spaced apart from both the source and drain regions. Sufficient conductivity is inherently provided on either side of the gate in depletion-mode devices. Reducing active region thickness, or doping concentration, to make an enhancement mode device, undesirably reduces conductivity alongside the gate, which undesirably increases resistance, particularly source resistance $R_s$ which also reduces device gain.

Two different enhancement-mode GaAsFET design approaches have been developed, which endeavor in different ways to maintain adequate active region conductivity alongside the gate, while obtaining enhancement-mode characteristics beneath the gate. One approach is to use a thin active layer, disposed close to the substrate surface beneath a planar gate, together with self-aligned implants on either side of the channel. The other approach is to use a deep active layer, together with a gate which is recessed into the substrate to provide a thin channel beneath the gate but thicker conductive regions on either side of the gate. Examples of these two design approaches are next described.

An early self-aligned GaAsFET gate process is described in an article entitled "EB-Writing N+ Self-Aligned GaAs MESFETs for High-Speed LSIs," International Electron Devices Meeting, December 1982, by K. Yamasaki, N. Kato, Y. Matsuoka, and K. Ohwada and in "Self-Align Implantation for N+-Layer Technology (SAINT) for High-Speed GaAs Ics," Electron. Lett. V. 18, pp. 119-121, February 1982, by K. Yamasaki, K. Asai, T. Mizutani, and K. Kurumada. The described SAINT process is intended to produce very high-speed GaAsFETs by reducing gate length. In this process, a multi-layer self-aligned implant mask is applied to a semi-insulating GaAs substrate, upon which a silicon nitride passivation film has been deposited. The bottom mask layer is selectively etched to undercut the mask. After N+ implantation, a layer of $SiO_2$ is applied, the mask is removed, the silicon nitride film is plasma etched to expose the substrate, and the gate metal is applied. The foregoing procedure produces a planar self-aligned gate contact which has a length in contact with the substrate that is defined by the edges of the $SiO_2$ layer and is spaced inward of the N+ implants. Unfortunately, use of a planar gate forfeits the ability to manipulate the physical thickness of the active layer. Only dopant concentration and doping depth of the active layer remain for manipulation to regulate enhancement-mode device characteristics.

Alternatively to the planar self-aligned gate configuration described above, it has been proposed to form a recess in the substrate to receive the gate metallization. For example, a recessed gate has been incorporated into the non-aligned GaAsFET structure disclosed in the foregoing article by Rode, et al. This approach has certain advantages over a planar gate contact, particularly in controlling the effective thickness of the active layer of the device. The depth of the recess can be manipulated, in addition to doping concentration and overall depth of the active region, to control enhancement-mode characteristics of the device. Use of a recessed gate also allows the active region to be made relatively thick alongside the gate to maintain conductivity and to minimize surface depletion effects which can reduce device gain.

Difficulties arise, however, in accurately positioning the recess, which must be formed prior to applying the gate. In particular, it is difficult to position the recess and gate consistently relative to the source and drain regions. Consequently, use of a recessed gate has not found wide acceptance. The 1984 Technical Digest of the IEEE GaAs IC Symposium reports the current state of the gallium arsenide integrated circuit art. In the area of circuit fabrication, articles entitled "A Self-Aligned Gate Modulation-Doped (Al,Ga)As/GaAs FET IC Process," by N. C. Cirillo, Jr., J. K. Abrokwah, and S. A. Jamison (pp. 167-170) and "A Low Power Gigabit IC Fabrication Technology," M. J. Helix, S. A. Hanka, P. J. Vold, and S. A. Jamison (pp. 163-166) both reject the use of recessed gate designs in favor of planar gate designs in making self-aligned gate enhancement-mode GaAs MESFETs and MODFETs.

Another problem arises in annealing self-aligned GaAsFETs after gate deposition. Furnace annealing is conventionally carried out over, e.g., 20 minutes, at about 800° C. At such high temperatures a difference in coefficients of thermal expansion produces stresses at the interface between the metal gate and gallium arsenide, causing inferior Schottky barrier properties. Migration of impurities from the gate metallization into the channel region during annealing also degrades device performance, as does lateral diffusion of the implanted silicon ions. These problems contribute to very low yields of operative GaAs devices. In the process described in the above-mentioned paper by Cirillo, et al., the researchers try to minimize these problems by using a rapid thermal anneal to activate the self-aligned gate implants instead of conventional furnace annealing. This manner of annealing appears from the report of Cirillo, et al. to offer satisfactory results but does not totally avoid heating, for a short time, of the Schottky interface. Metal can diffuse very rapidly at annealing temperatures. It remains to be seen whether rapid annealing such self-aligned devices will prove acceptable in production process. In view of the current lack of understanding of the physics of the Schottky interface, it would be preferable not to risk degradation of the gate by metal diffusion. The SAINT process, reported above by K. Yamasaki, et al., avoids such risk and seeks to controllably separate the N+ self-aligned implants from the planar gate contact by a distance equal to the expected lateral diffusion of the N+ implants. Known recessed gate designs likewise apply gate metalization after annealing.

Another limitation of prior self-aligned gate processes is that the implants on each side of the gate are essentially identical in dopant concentration. On one hand, it is preferable to have a high doping concentration between the source and gate to minimize source resistance $R_S$. On the other hand, it is preferable to have a low doping concentration in the drain side implant to minimize gate/drain capacitance $C_{GD}$. In conventional self-aligned gate processes, however, it is impractical to provide asymmetrical implant doping concentrations. In the SAINT devices described above, spacing the gate contact inward of the self-aligned N+ implants improves drain capacitance but degrades source resistance. In recessed gate devices, the difficulty of consistently positioning the recessed gate relative to the gate and drain implants makes these parameters highly variable, contributing to low device yield. It would be preferable for gate position to be noncritical.

Finally, it is well recognized as desirable to minimize gate dimensions, but the ability to minimize gate length is limited by difficulties in photolithographically reproducing small (e.g., submicron) features in photoresist. Also, the use of a very small dimension gate metalization produces a high gate metal resistance, $R_{in}$. Smaller gate lengths also make it more difficult reliably to transfer small features from the photoresist into the wafer. For example, in the aforementioned SAINT process, it is difficult to control actual gate dimensions. The edges of the $SiO_2$ layer are wedge-shaped because they are not deposited in a direct line of sight from the sputtering source. For the same reason, the structural integrity of the edges is poor. The edge of the $SiO_2$ also is etched back by plasma. Consequently, the resulting gate is longer than the undercut mask and edge definition is poor.

Accordingly, a need remains for an improved self-aligned gate structure and process for fabricating self-aligned gates and to facilitate further reductions in gate length.

SUMMARY OF THE INVENTION

One object of the inventon is, therefore, to improve upon prior self-aligned gate processes.

Another object is to provide an improved enhancement-mode GaAsFET gate structure.

A further object is to minimize gate length beyond the limits of photolithography.

An additional object is to reduce both source resistance $R_S$ and gate-drain capacitance $C_{GD}$.

Still another object is to facilitate accurate, reliable transfer of small gate features from photoresist into device structure while maintaining a low gate metal resistance $R_{in}$.

Yet another object of invention, as aforementioned, is to make more consistent the structure and characteristics of submicron gate GaAsFET devices fabricated by photolithographic techniques.

This invention provides a self-aligned gate GaAsFET in which the gate metallization is offset to one side of the channel, preferably aligned with the source-side implant. This arrangement is advantageously provided by a fabrication process in which a pair of self-aligned implants are made, before gate metallization, at a spacing, e.g. 1 μm, readily obtainable in photoresist. As an intermediate step, a first etch-resistant dielectric patch is deposited over at least one of the self-aligned implants aligned therewith by the photoresist mask. Then, using a second photoresist mask, a second such patch of convenient size, e.g., 1 μm, is deposited so as to overlap the other self-aligned implant and extend a distance over the gap or channel between the two implants. The resultant edges of the first and second patches are thereby spaced, e.g., 0.5 μm, apart, closer together than the implants, and are aligned with one of the implants. The patches fix the gate length at less than implant spacing and offset the gate metallization along the source-side self-aligned implant, away from the drain implant. The gate is preferably recessed. The dielectric patch material and the substrate material are selected to have approximately equal coefficients of thermal expansion: zirconium oxide (ZrO) is preferred for use on a gallium arsenide (GaAs) substrate. This process frees gate length from the small-dimensional constraints of photolithography. The process also effectively provides asymmetrical doping concentrations on opposite sides of the gate conductor, which enables reductions in both gate-drain capacitance $C_{gd}$ and source resistance $R_S$.

Additional objects, features and advantages of the invention will become more readily apparent from the following detailed description of a preferred embodiment thereof, which proceeds with reference to the accompanying drawings.

BRIEF DESCRIPTION OF DRAWINGS

FIG. 1 is a cross-sectional view of a portion of a GaAs substrate following deposition of a first dielectric layer and two photolithography steps, the first followed by implantation of an N— doped region generally defining the channel region, and the second followed by an N+ implant step to define the source and drain regions of the device.

FIG. 2 shows the substrate portion of FIG. 1 following a third photolithography step, followed by a third, self-aligned gate-defining N+ implant into closely-spaced regions overlapping the N+ implants of FIG. 1 and a first ZrO deposition step.

FIG. 3 shows the substrate portion of FIG. 2, following a fourth photolithography step and second ZrO deposition step.

FIG. 4 shows the substrate portion of FIG. 3 following the removal of the fourth photoresist mask and zirconium oxide deposited thereon, and deposition of ohmic contacts.

FIG. 5 shows the substrate portion of FIG. 4 following a sixth photolithography step and plasma and chemical gate-etching steps.

FIG. 6 shows the substrate portion of FIG. 5 following gate metallization.

FIG. 7 shows the substrate following deposition of a third and fourth dielectric layer, metallization of the source and drain contacts, and air bridge fabrication.

DETAILED DESCRIPTION OF PREFERRED EMBODIMENT

A semi-insulatng GaAs wafer is used as the substrate 10 in carrying out the process of FIGS. 1–7. The wafer is cut so that the deposition surface 12 is in the 100 crystallographic plane and the gate is aligned so that, when etched as illustrated in FIG. 6, a recessed channel is formed with inwardly-sloping sides, as described hereinafter.

Referring to FIG 1, following customary wafer cleaning procedures and inspection, a first dielectric layer 14 of silicon nitride ($Si_3N_4$), having a thickness of 1,000–5,000 Å, is deposited over the entire surface of the substrate 12. This deposition step is followed by a first photolithography masking step (not shown) to define a channel region 17. The channel region is oriented to align the gate parallel to the $<0\bar{1}1>$ direction on the seed face of the substrate. Silicon ions are then implanted through opening 17 in the photoresist 16 and through layer 14 into the GaAs substrate to produce an N− (e.g., $3 \times 10^{17}$ average dopant concentration) implant 18 in the channel region. The ion implant energies are controlled to produce an active layer having a total effective thickness greater than is used in planar self-aligned enhancement-mode GaAsFETs, e.g., on the order of 2,000–3,000 Å, anticipating recessing the gate in FIGS. 6 and 7 to a depth of, e.g., 800–1,000 Å. The foregoing dimensions may be adjusted as needed for a particular application. Upon completion of the N− implant, the first photoresist layer is removed.

A second photolithography step is performed to provide a photoresist mask 20 defining a pair of openings 22 spaced apart about the center of the N− implant 18 and overlapping the outer periphery of the N− implant. A second implant step is performed to implant silicon ions to a depth approximately twice the depth of the N− implant 18 and to an N+ (e.g., $2 \times 10^{18}$) average dopant concentration to form source and drain implant regions 24, 26. Photoresist mask 20 is then removed.

In FIG. 2, a third, photolithography step is performed. This step provides a photoresist layer 30 defining a pair of openings 32 which, like openings 22 in FIG. 1, are centered in channel region 18, but are smaller and spaced closely together so as to overlap the inner periphery of the first N+ implants 24, 26. Preferably, the spacing of openings 32 is as close as practical. In present photolithographic techniques, a photoresist bridge 30a can be reliably made with a width 33 as little 1 μm. For this example, it is assumed that width 33 equals 1 μm, with the understanding that the principles of the invention can be applied to smaller dimensions as photolithographic techniques continue to improve.

A third implant step is next performed, to implant silicon ions through openings 32 to form self-aligned source-side and drain-side implant regions 34, 36. Ions are implanted in regions 34, 36 to a slightly lower concentration than in the N+ implant step of FIG. 2 (e.g., $1 \times 10^{18}$) and to a depth intermediate the N− and N+ implants of FIG. 1.

Thus, a stair-stepped doping pattern is provided by the sum of the average implant concentrations. The least dopant concentration occurs in the channel region in a gap, 38, between self-aligned implants 34, 36, beneath center mask element 30a. The greatest concentration occurs generally in the self-aligned implant regions 34, 36, but with decreasing gradations proceeding from regions of maximum concentration where implant regions 18, 24, 34 and 18, 36, 26 all overlap, proceeding inward toward gap 38 and downward into the substrte.

Continuing to utilize mask 30, a second dielectric layer, this time a thin (e.g., 200 Å) layer of zirconium oxide (ZrO) is deposited on the surface of the first dielectric layer 14 through openings 32 and, non-essentially, atop the photoresist layer 30. Patches 40a, 40b are thus formed on either side of gap 38, which patches cover implants 34, 36 in precise self-alignment with the edges of such implants. Next, the photoresist layer 30 is removed, which removes the zirconium oxide layer 40 deposited atop the photoresist, but leaves the zirconium oxide patches 40a, 40b deposited atop the silicon nitride first dielectric layer 14.

Referring to FIG. 3, a fourth, gate-offsetting photolithography step provides a photoresist layer 39 with a single opening 41 over the gate active region. Opening 41 is the same size as openings 32 (e.g., 1 μm) but offset toward the center of gap 38 so as to encompass both a portion (e.g., half) of gap 38 and an adjoining portion of drain-side patch 40b. Offset alignment can be easily controlled down to 0.2–0.3 μm. Finally, a second zirconium oxide layer 42 is deposited to form a ZrO patch 42a within opening 41.

Next, in FIG. 4, photoresist layer 39 is removed which also lifts off any zirconium oxide deposited on the photoresist. The ZrO patches and intervening $Si_3N_4$ surface within gap 38 are thereby exposed. The exposed surface within the gap is reduced by the second ZrO deposit to a width 43, between the edges of patches 40a and 42a, about half the width of original gap 33, and is spaced away from the inward boundary of drain implant 36.

Next, the wafer is furnaced annealed to activate the ion implants. Following annealing, a fifth, ohmic-contact photolithography step (not shown) is performed, followed by a plasma etch procedure to define ohmic-contact openings in silicon nitride layer 14 over the source and drain regions of the gate. These steps are followed by deposition of ohmic metal (Au-Ge-Ni) through the openings to form source and drain ohmic contacts 44, 46. Then, the ohmic metal deposition photoresist mask is removed. The ohmic metallization is then alloyed to the GaAs.

This step is followed in FIG. 5 by the deposition of a second layer 48 of silicon nitride over the entire surface area of the gate region. A sixth, gate photolithography step is performed to provide a mask of photoresist 50 over the entire channel region, having an opening 52 approximately centered over gap 38, but of somewhat wider dimensions than such gap. The silicon nitride layers 14, 48 are then plasma etched through opening 52. The thin zirconium oxide patches 40a, 42a resist the plasma etch and therefore confine the removal of material to a narrow channel aligned with the inward edges of the patches and of implants 34, 36, down to the substrate surface 12.

Next, with photoresist layer 50 still in place, the wafer is subjected to a liquid chemical etching process to form a gate recess or channel 54 in the substrate. A suitable chemical etchant is provided by a water mixture of dilute ammonium hydroxide and hydrogen peroxide, which selectively etches the gallium arsenide substrate, but not the silicon nitride and zirconium oxide dielectric layers. The current which flows when a nominal bias, e.g., 2.5 volts, is applied across the ohmic contacts (source and drain) is monitored to determine the stopping point in the etching process which will produce the desired pinch-off voltage, and therefore the depth to which channel 54 is etched.

Next, referring to FIG. 6, gate metal (Ti-Pd-Au) is deposited through opening 52 in mask 50. The resultant gate metallization 56 extends downward into recess 54 into contact with the N− doped region 18 in gap 38. The length 43 of the gate contact 56 at the surface 12 of the substrate is defined by the spacing of the inward edges of the zirconium oxide patches 40a, 42a, established in the deposition step of FIGS. 2 and 3, and unaffected by the etching steps. Correspondingly, the source-side edge of the gate contact is precisely aligned at substrate surface 12 with the inward edge of the self-aligned source implant 34, formed in FIG. 2. The drain-side edge of the gate contact is spaced a substantial distance, e.g., 0.5 μm, from drain implant 36.

The gate contact has a shape defined by the recess below substrate surface 12 which is approximately trapezoidal, that is, the gate contact has opposite sides 58 which are inclined inwardly, away from the inner boundary of implant 34 proceeding depthwise into the substrate. The shape of the gate recess was established at the beginning of the process by the choice of crystallographic face and in FIG. 1 by the orientation of the gate direction.

The length of the gate metallization above the zirconium oxide patches 40a, 42a is determined by the dimension of opening 52 in photoresist 50, established in FIG. 5. This dimension can be, and preferably is, greater than the gate contact length 43 so that any mask-to-wafer misalignment is noncritical. Making dimension 53 greater than gate contact length 43 also minimizes input gate resistance $R_{in}$, while providing the narrowest possible gate length in contact with the active implant region 18. Gate contact length 43 can be readily minimized below the limits of photolithography because this dimension is set, not by resolution capabilities of the photoresist, but by the alignment of the photoresist with the self-aligned implants in successive ZrO depositions. Gate contact dimensions and edge shapes are maintained through the etching steps by the ZrO patches. The self-aligned implants can therefore be spaced much closer together than the maximum length of the gate metallization, while the length of the gate metal contact with the gallium arsenide substrate can be substantially less than the spacing of the self-aligned implant. The foregoing procedure also allows the gate to be fabricated to include a gate recess, without requiring an intermediate masking step prior to gate metal deposition, to uniquely set the device threshold or pinch-off voltage.

Referring now to FIG. 7, after deposition of the gate metal, the gate metal photoresist layer 50 is removed. A third layer of silicon nitride is deposited to a thickness of about 1,000 Å. A seventh photolithography step is performed, the silicon nitride is plasma etched through openings in the photoresist, and a first layer of interconnect metal (Ti-Pd-Au) is deposited through the photoresist and openings in the silicon nitride to form metal interconnections 62, 64 with the ohmic metal contacts 44, 46, respectively. The photoresist is then removed. A fourth layer 66 of silicon nitride is then deposited over the circuit of FIG. 7 to a thickness of about 1,000 Å.

Further conventional steps, not essential to the present invention, complete the circuit by providing an air bridge interconnect 70 to the source contact 62 from another part of the circuit (not shown). This procedure includes an air bridge photolithography step to provide air bridge 68 followed by plasma etching the silicon nitride through an opening in the photoresist to expose source contact 62. Air bridge metallization (Ti-Au-Ti) is then deposited. A second air bridge photolithography step is performed to define the air bridge circuitry pattern. The air bridge metallization is gold plated and then the air bridge is etched in accordance with the gold plate defined pattern.

Self-aligned, recessed gate, enhancement-mode GaAsFETs have been constructed with 0.5 μm gate lengths in accordance with the foregoing description and successfully operated, but parametric device data is not available. Devices lacking the source-side offset feature have been tested in comparison with conventional non-aligned, recessed gate enhancement-mode GaAsFETs. The devices tested had a gate length of 1.0 μm and width of 300 μm. These measurements were taken at a bias of $V_{ds}+0.4$ V, $V_{gs}=0.4$ V. For comparison purposes, devices with identical pinch-off voltages should ordinarily be measured. In lieu of this, two devices of each type were measured, demonstrating that the dependence of the critical parameters on $V_p$ is smaller than the dependence on self vs. non-self-alignment.

| | | Comparison of DC and RF Parameters | | | |
|---|---|---|---|---|---|
| | | Self-Aligned | | Standard | |
| Parameter | (units) | #1 | #2 | #1 | #2 |
| $V_p$ | (volts) | .095 | .13 | .09 | .11 |
| Ids | (mA) | 6.5 | 5.4 | 3.0 | 3.3 |
| gm | (mS) | 37.8 | 35.0 | 16.95 | 21.53 |
| Ft | (GHz) | 8.95 | 8.69 | 4.39 | 5.3 |
| Vd | (ohms) | 156 | 191 | 137 | 140 |
| gmrd | (gain) | 5.9 | 6.7 | 2.3 | 3.0 |
| Cgd | (pf) | 224 | 212 | 213 | 215 |
| $R_s$ | (ohms) | 4.0 | 4.5 | 10.8 | 10.0 |

This data shows that improved Ids, gm, ft and $R_s$ are obtained from the self-aligned process. It also shows a minimal penalty in Cdg due to the spacing of the N+ drain implant slightly away from the drain side of the gate. Comparative I–V curve traces for the two types of devices also demonstrated that the devices of the invention provide lower knee voltage. Source-side offset devices should exhibit similar characteristics but should be faster, because of the shorter gate length, and capacitance $C_{gd}$ should be reduced.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A source side self-aligned gate process for fabricating an integrated circuit device comprising:

providing a substrate having a reference surface and an active device region in the material of the substrate;

masking the substrate surface over the active device region with an ion-opaque, removable first mask layer;

forming a pair of spaced-apart openings in the mask within the active device region;

implanting ions through the pair of openings into the active device region to form a pair of self-aligned implant regions spaced apart from a gap having a first length defined by the spacing of the openings;

depositing a first dielectric layer through the mask openings onto the substrate surface so as to cover the self-aligned implant regions;

removing the first mask layer and any of the first dielectric layer deposited thereon while leaving first and second spaced-apart dielectric patches covering the self-aligned implant regions and aligned therewith;

masking the substrate surface and the first and second dielectric patches with a second mask layer;

forming a single opening in the second mask layer in the active device region in a location and of a length encompassing a portion of said gap and an overlappingly intersecting an adjoining portion of the first patch;

depositing a second dielectric layer through said single mask opening onto the substrate;

removing the second mask layer and any of the second dielectric layer deposited thereon while leaving a third dielectric patch covering said portions of the gap and the first patch and spaced from the second patch to define a reduced gap therebetween;

depositing a gate conductor material in the gap to form a gate having a gate contact in contact with the substrate material in the reduced gap, the gate contact having a length defined by the spacing across the reduced gap between the second and third patches of dielectric material.

2. A gate process according to claim 1 including:

masking the reference surface and the patches of dielectric material with a third mask layer;

forming a single opening in the third mask layer in a location and of a length encompassing said reduced gap and adjoining portions of the second and third dielectric patches; and depositing said gate conductor material through the opening in the second mask.

3. A gate process according to claim 2, including:

composing the substrate of an etchable material;

composing the dielectric layer of a non-etchable material; and prior to the gate conductor deposition step, etching the substrate material through the opening in the third mask to form a recess in the substrate to predetermined depth in said active region and having at said reference surface a maximum length defined by the gap between the two patches of dielectric material.

4. A gate process according to claim 3 including:

selecting for said substrate material a crystalline material having a crystallographic structure which etches anisotropically;

selecting as said reference surface a face of the material such that the material etches at a non-normal inclination to the reference surface; and orienting the gate so that the recess is formed with sides inclined inward proceeding depthwise into the substrate so as to space the gate conductor material away from the gate implant regions at said predetermined depth.

5. A gate process according to claim 1, including:

composing said dielectric layer of a non-etchable material; and depositing a preliminary dielectric layer of etchable material on the substrate surface prior to the first masking step; and prior to the gate conductor deposition step, etching the preliminary dielectric layer through the opening in the second mask to expose the substrate material.

6. A gate process according to claim 1 including:

composing the substrate of a first material etchable by a first etchant;

depositing a preliminary dielectric layer, composed of a second material etchable by a second etchant, on the reference surface of the substrate prior to the first masking step;

selecting for the deposition of the dielectric layer defining said patches, a third material which is resistant to the first and second etchants; and etching the preliminary dielectric layer and the substrate with the first and second etchants, respectively, to form a recess in the reduced gap having a length defined by the spacing of the second and third patches.

7. A gate process according to claim 6 in which the first material is GaAs; the second material includes $Si_3N_4$; and the third material is ZrO.

8. A gate process according to claim 1 including annealing the substrate prior to the step of depositing gate material.

9. A gate process according to claim 1 including selecting for said dielectric layer and for said substrate, materials having approximately equal coefficients of thermal expansion.

10. A gate process according to claim 9 in which the substrate material is GaAs and the dielectric material is ZrO.

11. A gate process according to claim 1 including sizing the opening in the second mask layer so that the second length is greater than the first length.

12. A source-side self-aligned gate process for making submicron gates in integrated circuits, comprising:

providing a semi-insulating substrate having a reference surface;

depositing a first dielectric layer over said surface;

doping a first defined area of the substrate to a first dopant concentration and a first depth;

doping a pair of second defined areas of the substrate, overlapping the first defined area and spaced apart therein at a first spacing, to a second concentration and a second depth that are greater than the concentration and depth of doping in the first area;

doping a pair of third defined areas of the substrate, to a third dopant concentration less than the second concentration and a depth greater than the first depth, the third areas overlapping the second areas within the first area and spaced apart therein to define inward dopant boundaries between the first and third concentrations at a second spacing less than the first spacing;

depositing a second dielectric layer atop the first dielectric layer, over one of the third areas so as to define a first dielectric patch having a first edge which is aligned with one of said inward dopant boundaries;

depositing a third dielectric layer over the other third area and a limited adjoining portion of the first area to define a second dielectric patch having an edge in the first area spaced apart from the edge of the first dielectric patch to form a gap having a length less than said second spacing; and depositing a conductive gate material in the gap to form a gate contact with the first area which is aligned with the inward boundary of said one third area and spaced inwardly from the inward boundary of the other of the third areas.

13. A process according to claim 12, including selectively removing the first dielectric layer in the gap, leaving the second and third dielectric patches substantially intact, prior to deposition of the conductive material.

14. A process according to claim 12, including selectively etching the first dielectric layer and the substrate material within the gap, the second and third dielectric layers being etch-resistant, to form a recess in the substrate prior to deposition of the conductive material.

15. A process according to claim 12 including:

depositing a fourth dielectric layer over said surface including over said first, second and third areas, the first and fourth dielectric layers each being formed of a dielectric material removable by a predetermined etchant and the second and third dielectric layers being formed of a different dielectric material resistant to said etchant;

masking the fourth dielectric layer with a mask layer and forming an opening in the mask layer approximately aligned with said first area; the mask layer being formed of a mask material resistant to said etchant and otherwise removable;

etching through the opening with said predetermined etchant to remove portions of the first and fourth dielectric layers exposed within the gap and thereby expose a portion of the reference surface of the substrate;

etching the exposed portion of the substrate surface so as to form, within the gap, a recess in the substrate having a predetermined depth from the reference surface;

depositing said conductive gate material through the opening into the gap and the recess; and removing the mask material.

16. A source side self-aligned gate for making submicron gates in integrated circuits, comprising:

providing a semi-insulating substrate having a reference surface;

depositing a first dielectric layer over said surface;

applying a first layer of photoresist over the first dielectric layer and forming a pair of closely spaced apart openings extending through the photoresist to expose a surface portion of the first dielectric layer through said openings;

doping a pair of areas of the substrate to define two implanted regions having implant boundaries substantially aligned with said openings and spaced apart to define a first gap between the regions;

depositing a second dielectric layer on the photoresist and within the openings atop the surface portion of the first dielectric layer exposed therein;

removing the first layer of photoresist, thereby removing any of the second dielectric layers deposited thereon and leaving a pair of areas of the second dielectric layer atop the first dielectric layer extending over the pair of implanted regions and having dielectric boundaries spaced closely apart in accordance with the spacing of the openings;

applying a second layer of photoresist over the first and second dielectric layers;

positioning and forming a first single opening extending through the second photoresist layer so as to expose a portion of only one of the pair of areas of the second dielectric layer and an adjoining surface portion of the first dielectric layer spaced apart within the first gap from the other of the pair of areas of the second dielectric layer;

depositing a third dielectric layer on the photoresist and the surface portions of the first and second dielectric layers exposed within the first single opening;

removing the second layer of photoresist, thereby removing the third dielectric layer deposited thereon and leaving an area of the third dielectric layer atop said exposed portions of the first and second dielectric layers, the second and third dielectric layers together extending over the pair of implanted regions and having dielectric boundaries spaced closely apart to define a second gap of reduced length in accordance with the spacing of the openings;

masking the surface with a mask layer and forming a second, single opening therethrough approximately in alignment with a portion of gap between the implanted regions to expose a surface of the first dielectric layer between said dielectric boundaries;

selecting for the first and third dielectric layers a material which is removable by a predetermined etchant and selecting for the mask layer and second dielectric layer materials which are resistant to said etchant;

etching through the second opening with the predetermined etchant selectively to remove the first dielectric layer and thereby expose a portion of the substrate bounded by the boundaries of said second dielectric layer;

etching the exposed portion of the substrate surface so as to form a recess, the substrate in the gap having a predetermined depth from the reference surface;

removing the mask material;

depositing a conductive gate material within at least the second gap and the recess.

17. A gallium arsenide integrated circuit gate structure, comprising:

a GaAs substrate having a reference surface;

a first region within the substrate doped to a first dopant concentration;

a pair of second regions spaced apart about and adjoining opposite sides of the first region within the substrate, each second region being doped to a second dopant concentration greater than the first concentration and defining first and second dopant gradient boundaries on opposite sides of the first region extending depthwise into the substrate from the reference surface;

a dielectric layer covering a portion of the substrate surface including each of the second doped regions and a portion of the first doped region, the dielectric layer having a gap in the first region defined by spaced apart first and second edges; and conductive gate material defining a gate in contact with the substrate in the gap between the first and second edges of the dielectric layer;

the first edge being aligned with the first dopant gradient boundary and the second edge being spaced between the dopant gradient boundaries so as to define a gate length less than the spacing between the two second doped regions and to space the conductive gate material away from the second gradient boundary.

18. A GaAs gate structure according to claim 17 including means defining a channel recessed depthwise into the substrate in the first doped region between said two edges of the dielectric layer, the conductive gate material filling the channel.

19. A GaAs gate structure according to claim 18 in which the channel has a sidewall adjoining the first edge of the dielectric layer at the reference surface and being inclined inwardly of the channel proceeding downward so as to space the conductive gate material away from the first gradient boundary.

20. A GaAsFET according to claim 17 in which the second regions define a source region and a drain region, the gate being offset in the first region so as to be aligned with the gradient boundary of the source region and spaced from the drain region.

* * * * *